(12) United States Patent
Takarabe (10) Patent No.: US 6,515,916 B2
(45) Date of Patent: Feb. 4, 2003

(54) COLUMN SWITCH IN MEMORY DEVICE AND CACHE MEMORY USING THE SAME

(75) Inventor: Yukihiro Takarabe, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/768,317

(22) Filed: Jan. 25, 2001

(65) Prior Publication Data

US 2001/0030892 A1 Oct. 18, 2001

(30) Foreign Application Priority Data

Jan. 26, 2000 (JP) ........................................ 2000-021835

(51) Int. Cl.[7] .................................................. G11C 7/00
(52) U.S. Cl. ............... 365/189.08; 365/49; 365/189.07; 365/207; 365/208
(58) Field of Search ............................... 365/189.05, 49, 365/207, 208, 189.08, 189.07

(56) References Cited

U.S. PATENT DOCUMENTS

| | | | | |
|---|---|---|---|---|
| 5,784,705 A | * | 7/1998 | Leung ................... | 365/189.05 |
| 5,920,510 A | * | 7/1999 | Yukutake et al. ...... | 365/189.05 |
| 5,936,909 A | * | 8/1999 | Sonoda et al. ......... | 365/230.03 |
| 6,094,393 A | * | 7/2000 | Tran ........................... | 365/205 |

* cited by examiner

*Primary Examiner*—Son T. Dinh
(74) *Attorney, Agent, or Firm*—Rader, Fishman & Grauer PLLC; Ronald P. Kananen (57) ABSTRACT

A cache memory is provided with a tag memory for storing tag information and a column switch having an XOR calculation function, XOR calculation for judging whether the tag information and an address match is performed on every bit on a signal having a small amplitude on a bit line, and a high speed logic calculation can be realized, thus, there is an advantage that a cache memory capable of attaining a shorter access time can be realized.

5 Claims, 4 Drawing Sheets

COLUMN SWITCH IN MEMORY DEVICE AND CACHE MEMORY USING THE SAME

BACKGROUND OF THE INVENTION

1. Field of the Invention

The present invention relates to a column switch in a memory device having a logic calculation function used at reading tag memory data of a cache memory and a cache memory using the same.

2. Description of the Related Art

In a computer and other data processing apparatus including a central processing unit (CPU) and a main memory, a cache memory is provided separately from the main memory and able to be accessed at a high speed. When the main memory in the CPU is accessed, accessed data and tag data relating to an address information of the data are temporarily stored in the cache memory. When the CPU again accesses data stored at the same address in the main memory next time, the data stored in the cache memory is output to the CPU instead of that stored in the main memory. Therefore, by using the cache memory, data accessing at a high speed can be realized when repeatedly accessing to data in the same memory area in the main memory, and currently, most computers are provided with cache memories. Also, an IC chip wherein a CPU and cache memory are integrated on the same semiconductor chip has become a product.

Figure 1:
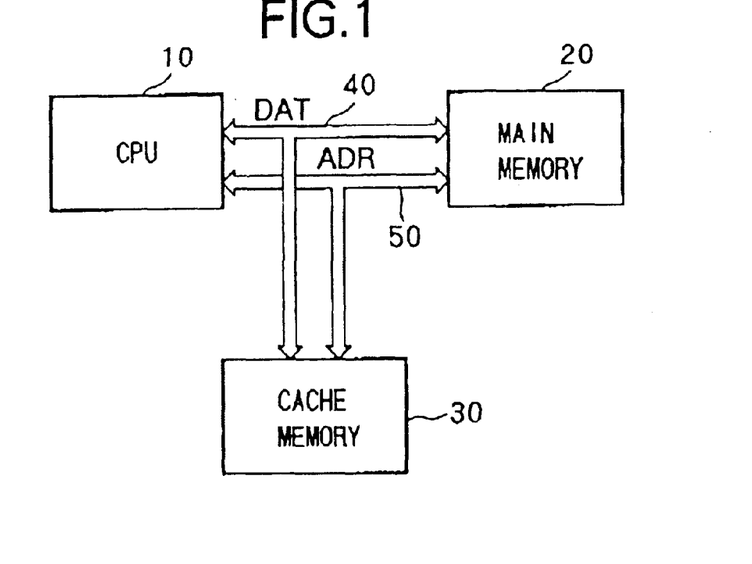
FIG. 1 is a block diagram of the configuration of a data processing system comprised of a CPU, a main memory and a cache memory.

FIG. 1 is a view of an example of the configuration of a data processing apparatus including a cache memory. As shown in the figure, the data processing apparatus is comprised of a CPU 10, a main memory 20 and a cache memory 30. A memory access, for example, reading data from the main memory is performed via a data but 40 and an address bus 50. The CPU 10 outputs an address signal ADR to the main memory 20 via the address bus 50, data stored at an address specified by the address signal ADR is read and transferred to the CPU 10 via the data bus.

At the same time with the above reading, the read data and a part of the address signal ADR relating thereto (for example, upper n bits in the m-bit address signal ADR, hereinafter, it is referred to as ADRa. Here, m and n are natural numbers and m>n.) are written in the cache memory 30. When the CPU reads data at the same address as the previous time from the main memory 20, data stored in the cache memory is read instead of that in the main memory 20 and supplied to the CPU 10. Since the cache memory 30 is comprised for example of an SRAM able to be accessed at a high speed, data reading at a higher speed can be realized compared with the main memory.

Figure 2:
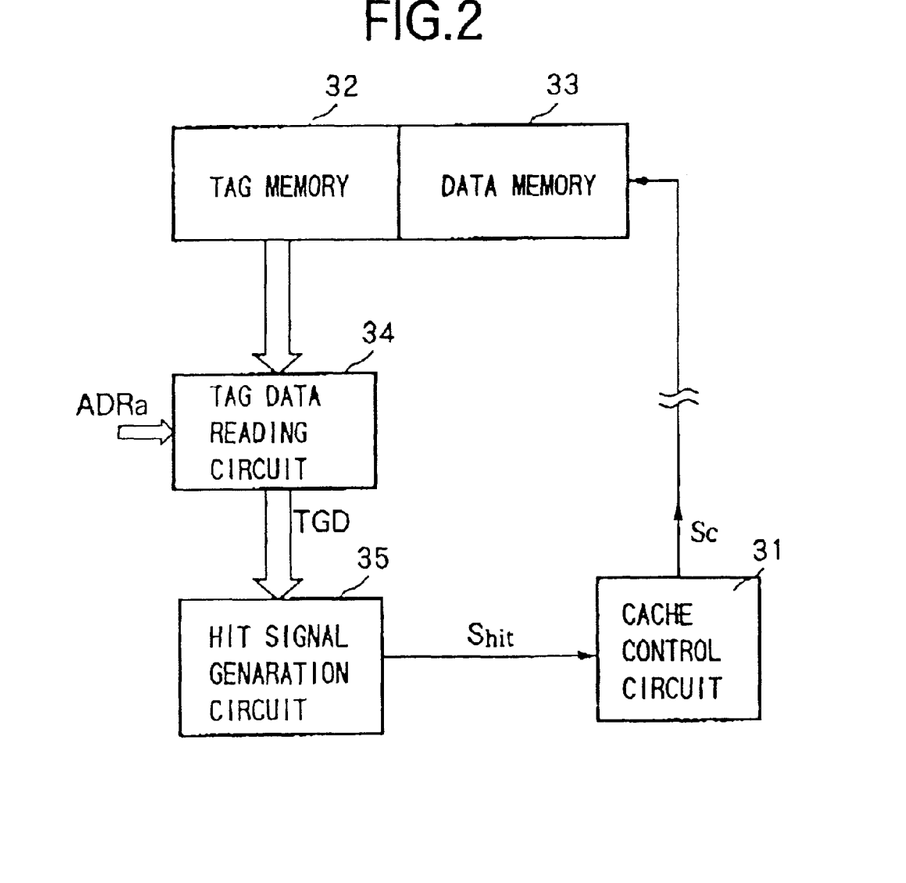
FIG. 2 is a block diagram of the configuration of a cache memory.

FIG. 2 is a view of an example of the configuration of the cache memory 30. As shown in the figure, the cache memory 30 is comprised of a cache control circuit 31, a tag memory 32, a data memory 33, a tag data reading circuit 34 and a hit signal generation circuit 35. Note that FIG. 2 is a simplified view showing only a portion relating to data reading in the cache memory 30. In an actual cache memory, partial circuits, such as a writing circuit for storing data, a data reading circuit for reading data from the data memory 33 at the time of hitting, etc., are included in the tag memory 32 and data memory 33, respectively, but they will be omitted here.

The cache control circuit 31 respectively controls writing and reading of data in the tag memory 32 and data memory 33. The tag memory 31 stores address information relating to data stored in the data memory 33 (hereinafter, referred to as tag data). Namely, when reading data from the main memory 20, reading data is stored in the data memory 33 and tag data relating to the reading data is stored in the tag memory 32.

The tag data reading circuit 34 reads the tag data TGD stored in the tag memory 32 and outputs to the hit signal generation circuit 35.

The hit signal generation circuit 35 compares the tag data TGD read by the tag reading circuit 34 and the address ADRa from the CPU 10 and outputs a hit signal $S_{hit}$ when the tag data TGD matches the address ADRa.

The cache control circuit 31, when receiving the hit signal $S_{hit}$ from the hit signal generation circuit 35, outputs a control signal SC to a not shown data reading circuit, reads data from the data memory 32 by the data reading circuit and outputs the same to the data bus 40.

With the provision of above mentioned cache memory 30, a high speed accessing can be realized and performance of the data processing apparatus can be improved without using any costly high speed memory as a main memory.

In the above cache memory of the related art, however, the tag data reading circuit 34 reads tag data from the tag memory 32 and a comparison circuit compares so as to generate a bit signal $S_{hit}$. The comparison circuit is comprised, for example, of an exclusive OR (XOR) circuit. A logic circuit performing XOR calculation is normally not capable of directly processing a weak read signal output from the tag memory, thus, the tag data reading circuit 34 amplifies the read signal by a sense amplifier to convert to have a sufficient amplitude level so that the logic circuit can perform processing and input the same to the logic circuit. The logic circuit for performing XOR calculation is comprised, for example, of a CMOS circuit and calculates a signal of a CMOS level, therefore, there arises a disadvantage that the processing speed declines due to dealing with a signal having a large amplitude and a generation speed of the hit signal declines.

Figure 3:
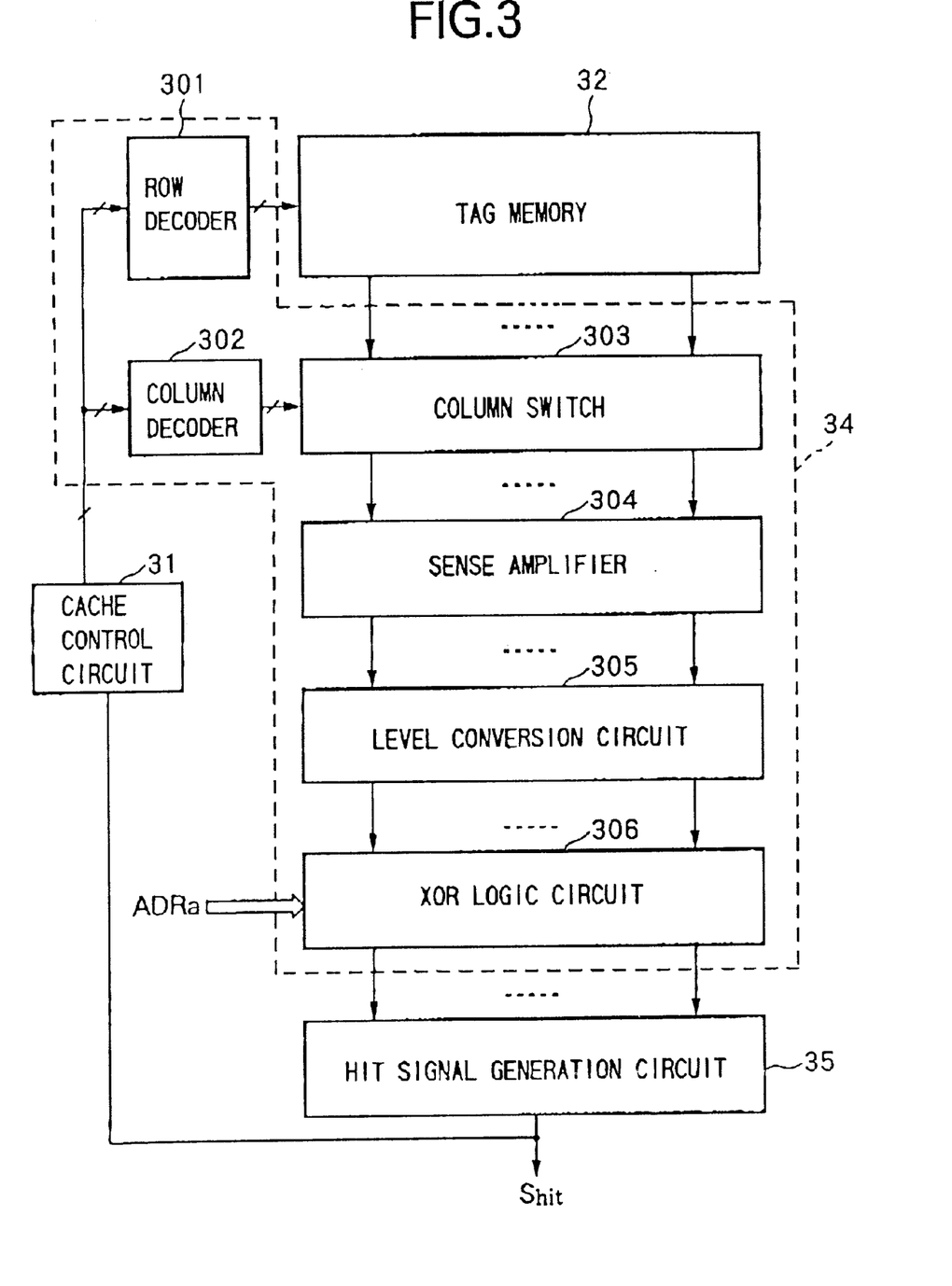
FIG. 3 is a view of the configuration of a cache memory in detail.

FIG. 3 is a view of a partial circuit of the cache memory including a cache control circuit 31, tag memory 32, tag data reading circuit 34 and a hit signal generation circuit 35. As shown in the figure, the tag data reading circuit 34 is comprised of a row decoder 301, column decoder 302, a column switch 303, sense amplifier 304, a level conversion circuit 305 and an exclusive OR circuit 306.

The tag memory 32 is a memory cell array comprised, for example, of a plurality of memory cells arranged in a matrix. Memory cells of the respective rows are connected to a plurality of word lines and memory cells of the respective columns are connected to a plurality of bit lines. The word lines and bit lines are selected by the row decoder 301 and the column decoder 302. Note that the row decoder 301 and the column decoder 302 are controlled by the cache control circuit 31.

The reading from the tag memory 32 is performed on a memory cell connected to a bit line selected by the column decoder 302 among the memory cells connected to the word lines selected by the row decoder 301. The column decoder 302 controls the column switch 303 and a read signal on the selected bit line is transferred to the sense amplifier 304. Stored data in the selected memory cell in the tag memory 32 is read in accordance with a voltage level of a read signal of the selected bit line by the sense amplifier 304. The level conversion circuit 305 converts a level of an output signal of the sense amplifier 304 and provides the same to the exclusive OR circuit 36. For example, assuming that the XOR circuit 306 is comprised by the CMOS circuit, the level conversion circuit 305 converts an amplitude level of the output signal of the sense amplifier 304 to be a CMOS level.

The XOR circuit 306 obtains an exclusive OR of every bit in the tag data from the level conversion circuit 305 and in the address signal ADRa input via the address bus, and outputs the results to the hit signal generation circuit 35. The XOR circuit 306 compares the read tag data and an input address signal ADRa and provides the comparison result to the hit signal generation circuit 35. The hit signal generation circuit 35 generates a hit signal $S_{hit}$ in accordance with matching or unmatching of the comparison result and supplies the same to the cache control circuit 31.

As explained above, in the XOR circuit 306 used for comparison calculation of the tag data and the address signal ADRa, for example a signal of a CMOS level is dealt, so a weak signal output from the column switch 303 is amplified in the sense amplifier 304, converted by the level conversion circuit 305, and then, supplied to the XOR circuit 306. Since logic calculation is performed on a signal having a large amplitude, the calculation time of the comparison result becomes long and a cache at a high speed is affected.

SUMMARY OF THE INVENTION

An object of the present invention is to provide a cache memory capable of making an access time short by realizing high speed logic calculation of an address and tag information by using a column switch having a logic calculation function.

To attain the above object according to the present invention, there is provided a column switch in a memory device, wherein each memory cell in the memory device is connected to a bit line and an auxiliary bit line, for outputting a differential voltage set on the bit line and auxiliary bit line in accordance with memory data of the memory cell at when reading data from the memory cell, said column switch receiving an input signal of a first or second logic state, and outputting a differential signal on the bit line and auxiliary bit line to the sense amplifier when the input signal is in the first logic state, and outputting a differential signal on the bit line and auxiliary bit line being logically inversed and outputs to the sense amplifier when the input signal is in the second logic state.

Preferably, a column switch of the present invention comprises a first switching element connected between the bit line and a first input terminal of the sense amplifier; a second switching element connected between the auxiliary bit line and a second input terminal of the sense amplifier; a third switching element connected between the bit line and the second input terminal of the sense amplifier; and a fourth switching element connected between the auxiliary bit line and the first input terminal of the sense amplifier; and wherein the first and second switching elements become conductive when the input signal is in the first logic state, and the third and fourth switching elements become conductive when the input signal is in the second logic state.

Preferably, the first and second switching elements are respectively connected between the bit line and the first input terminal of the sense amplifier, and between the auxiliary bit line and the second input terminal of the sense amplifier, and comprised of a transistor whose control terminal is applied the input signal; and the third and fourth switching elements are respectively connected between the auxiliary bit line and the first input terminal of the sense amplifier, and between the bit line and the second input terminal of the sense amplifier, and comprised of a transistor whose control terminal is applied a logically inversed signal of the input signal.

Furthermore, according to the present invention, there is provided a cache memory comprising a tag memory for storing tag information and a data memory for storing data corresponding to the tag information, for comparing an address and the tag information stored in the tag memory at the time of reading, and outputting the data corresponding to the tag information when the address and the tag information are matched, comprises a column switch being set a signal potential of a bit line connected to the respective memory cells in accordance with memory data of respective cells in the tag memory, and outputting a signal potential or a logically inversed signal of the signal potential of the bit line in accordance with the respective bits of the address being "0" or "1"; a sense amplifier for amplifying an output signal of the column switch; and a hit judgement circuit for judging whether or not the address and the tag information are matched in accordance with an output signal of the sense amplifier.

According to the present invention, a column switch having a logic calculation function is provided to a memory cell array of the tag memory for storing tag information, and the column switch controls a differential signal read from the memory cell of the tag memory to the bit line and auxiliary bit line in accordance with the respective bits of the address signal and outputs to the sense amplifier. For example, when a predetermined bit of the address signal is "0", a differential signal on the bit line and auxiliary bit line is output as it is to the sense amplifier, while when a predetermined bit of the address signal is "1", a logically inversed signal of a differential signal on the bit line and auxiliary bit line is output to the sense amplifier, thus, XOR calculation is performed on every bit of the read tag data and the address.

The signal from the column switch is amplified by the sense amplifier, and it is judged whether the tag information and the address are matched in accordance therewith, and a hit signal is output when they are matched. Since the XOR calculation is performed on the read signal having a small amplitude on the bit line as it is, a high speed logic calculation can be realized and a cache memory of high performance capable of attaining a shorter accessing time can be realized.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

Figure 4:
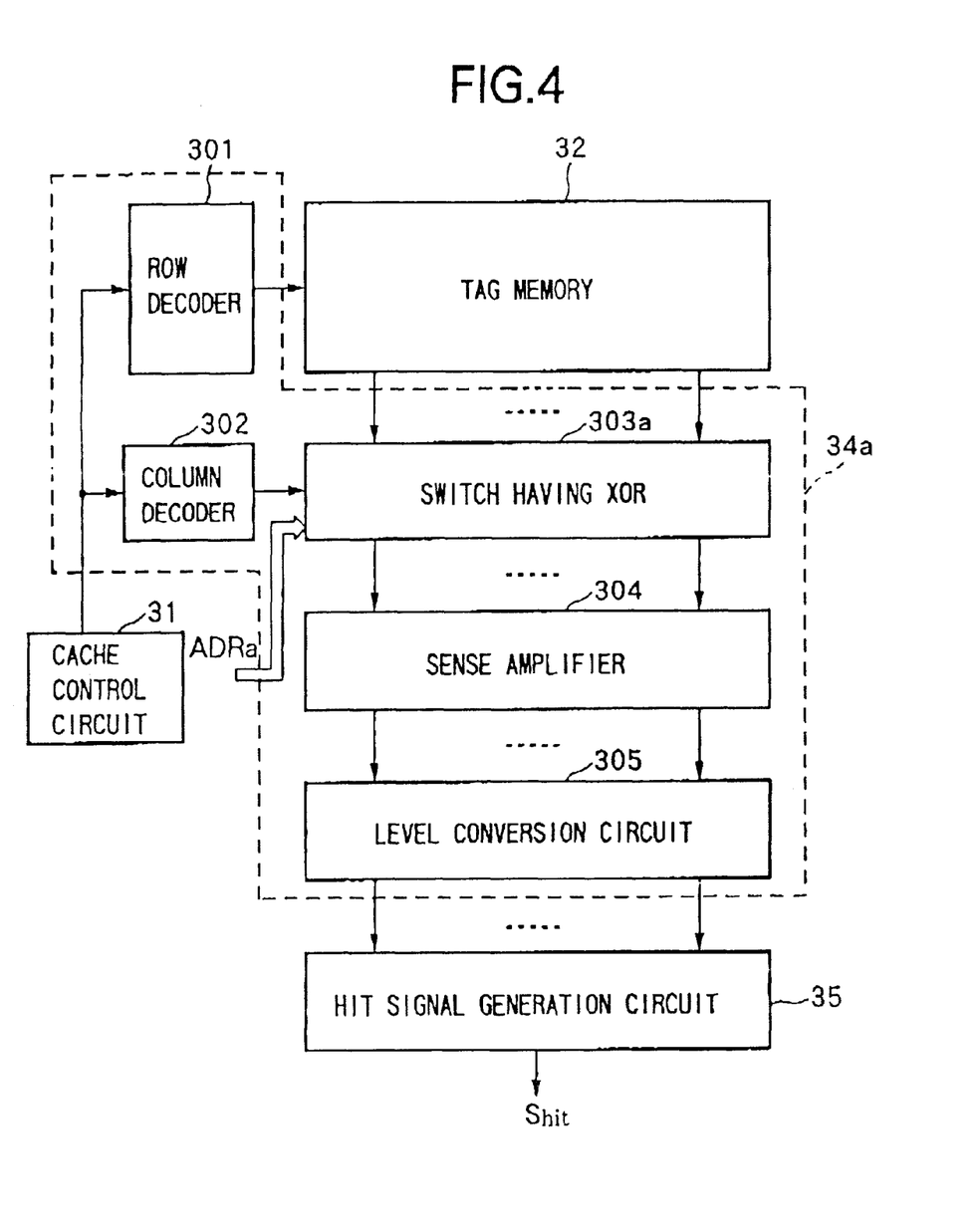
FIG. 4 is a circuit diagram of an embodiment of a cache memory according to the present invention.

FIG. 4 is a circuit diagram of an embodiment of a part of a cache memory according to the present invention. In FIG. 4, a configuration example comprising a cache control circuit 31, a tag memory 32, a tag data reading circuit 34a and a hit signal generation circuit 35. The overall configuration of the data processing apparatus including the CPU 10, main memory 20 and cache memory 30 and the configuration of the cache memory are as shown in FIG. 1 and FIG. 2.

As shown in FIG. 4, the tag data reading circuit 34a of the present embodiment is comprised of a row decoder 301, a column decoder 302, a column switch having an XOR calculation function 303a (it is referred to as a column switch having XOR in FIG. 4 for convenience, and hereinafter, referred to as such), a sense amplifier 304 and a level conversion circuit 305.

The tag memory 32 is a memory cell array comprised, for example, of a plurality of memory cells arranged in a matrix. Memory cells arranged on the same row are connected to one word line, and those on the same column are connected to one bit line. A plurality of word lines and bit lines wired as such are respectively selected by the row decoder 301 and column decoder 302.

The row decoder 301 and column decoder 302 respectively select a word line and a bit line in accordance with a row address and column address from the cache control circuit 31. For example, the row decoder 301 selects one from a plurality of word lines in accordance with a row address from the cache control circuit 31 and activates the same. The column decoder 302 outputs a column select signal in accordance with a column address from the cache control circuit 31. The column selection signal is output to the column switch having XOR 303a and controls bit line selection and XOR calculation.

The column switch having XOR 303a selects the designated bit line from among the plurality of bit lines in accordance with the column select signal from the column decoder 302, performs XOR calculation of a read signal of the selected bit line and an address signal ADRa input via an address bus, and supplies the calculation result to the sense amplifier 304.

The sense amplifier 304 amplifies the signal input from the column switch having XOR 303a and provides the amplified signal to the level conversion circuit 305.

The level conversion circuit 305 converts the amplitude level of the output signal of the sense amplifier 304 and supplies the same to the hit signal generation circuit 35. Note that when the hit signal generation circuit 35 can be sufficiently driven by the output signal from the sense amplifier 304, the level conversion circuit 305 may be omitted. Also, an output buffer can be provided instead of the level conversion circuit 305.

Comparing with the cache memory of the related art shown in FIG. 1, the cache memory of the present embodiment is given an XOR function to the column switch 304a, XOR logic calculation with an address signal ADRa is performed, the calculation result is amplified and output by the sense amplifier 304, and a hit signal $S_{hit}$ is generated in accordance therewith. Namely, in the present embodiment, since the XOR processing is performed on a reading signal on a bit line having a small amplitude, a higher speed can be attained than logic calculation at a CMOS level comparing with a cache memory of the related art.

Figure 5:
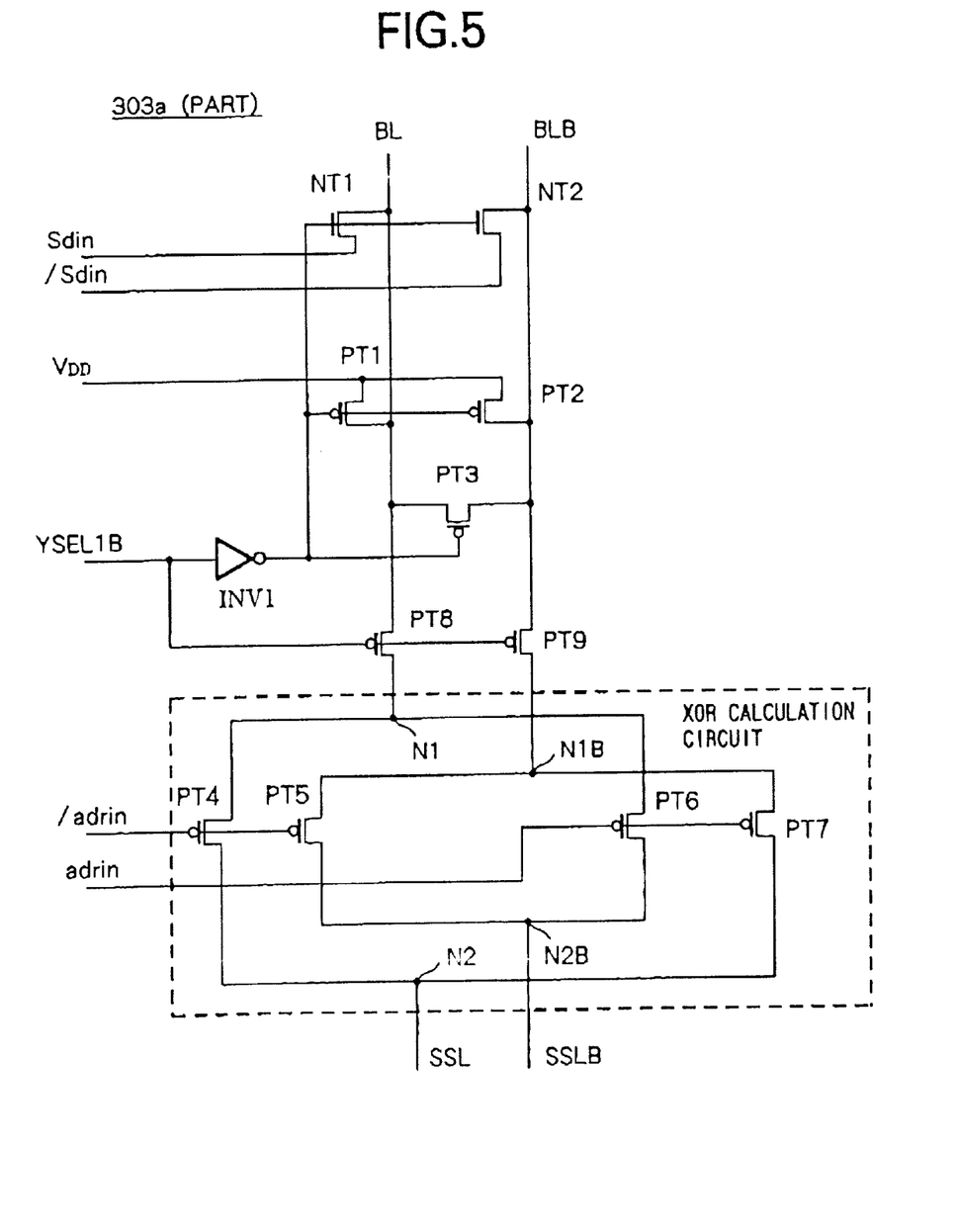
FIG. 5 is a circuit diagram of the configuration of a column switch having an exclusive OR function according to the present invention.

FIG. 5 is a circuit diagram of a partial configuration of the column switch having XOR 303a of the present embodiment. The configuration and operation of the column switch having XOR 303a will be explained with reference to FIG. 5 below.

As shown in FIG. 5, the column switch having XOR 303a is comprised of nMOS transistors NT1 and NT2 and pMOS transistors PT1, PT2, PT3, PT4, PT5, PT6, PT7, PT8 and PT9.

Note that it is assumed that the tag memory 32 shown in FIG. 4 is comprised, for example, of an SRAM and wherein a set of a bit line BL and a auxiliary bit line BLB are connected to each memory cell. Here, an explanation will be made by corresponding a state where the bit line BL is at a high level and the auxiliary bit line BLB is at a low level to "1", while a state where the bit line BL is at a low level and the auxiliary bit line BLB is at a high level to "0". Note that the correspondence relationship of data and voltages of the bit line/auxiliary bit line may be inversed and is determined by rules in a memory system.

The transistors NT1 and NT2 are input transistors for inputting writing data to the bit line BL and auxiliary bit line BLB. As shown in the figure, the transistor NT1 is connected between the bit line BL and a data input terminal sdin, and the transistor NT2 is connected between the auxiliary bit line BLB and data input terminal/sdin. Gates of the transistors are connected to an output terminal of the inverter INV1. Note that an input terminal of the inverter INV1 is connected to a column selection signal line YSEL1B. The column selection signal YSEL1B is controlled by the column decoder 302.

When writing tag data in the tag memory 32, the input terminals sdin and /sdin are set to be mutually logically inversed levels in accordance with the respective writing data. For example, when writing data "1" in a memory cell, the input terminal sdin is set at a high level and the input terminal /sdin is set at a low level. When the column selection signal line YSEEL1 falls from the high level to the low level, the output terminal of the inverter INV1 is held at a high level and the transistors NT1 and NT2 are turned on, so signals of the input terminals sdin and /sdin are applied by the bit line BL and the auxiliary bit line BLB, respectively, and written in the selection memory cell via the bit line BL and the auxiliary bit line BLB.

Note that writing of tag data to the tag memory 32 is not directly related to the present invention, so the detailed explanation will be omitted here.

The transistors PT1 and PT2 are connected between a supply line of the power source voltage $V_{DD}$ and a bit line BL and auxiliary bit line BLB. The transistor PT3 is connected between the bit line BL and the auxiliary bit line BLB. Gates of the transistors are both connected to the output terminal of the inverter INV1. The transistors PT1 and PT2 compose a precharge circuit and the transistor PT3 composes an equalizer circuit. When the column selection signal YSEL1B is at a high level, since the output terminal of the inverter INV1 is held at a low level, the transistors PT1, PT2 and PT3 are turned on and the bit line BL and auxiliary bit line BLB are both precharged at the power source voltage $V_{DD}$ level.

The transistor PT8 is connected between the bit line BL and the note N1, while the transistor PT9 is connected between the auxiliary bit line BLB and the node N1B. Gates of the transistors PT8 and PT9 are both connected to the column selection signal line YSEL1B. The column selection signal YSEL1B is controlled by the column decoder 302. For example, when the column selection signal line YSEL1B is held at a low level by the column decoder 302 at reading tag data, the transistors PT8 and PT9 are turned on and the bit line BL and auxiliary bit line BLB are selected. At this time, signals of the bit line and auxiliary bit line are output to the nodes N1 and N1B, respectively. Inversely, when the column selection signal line YSEL1B is held at a high level, the transistors PT8 and PT9 are held to be turned off, and the bit line BL and the auxiliary bit line BLB becomes non-selected.

The transistors PT4 to PT7 compose a logic calculation circuit for operating XOR calculation of a reading signal on the bit line BL and the auxiliary bit line BLB and the address signal ADRa. As shown in the figure, the transistor PT4 is connected between the nodes N1 and N2, while the transistor PT5 is connected between nodes N1B and N2B. The transistor PT6 is connected between the node N1 and N2B, while the transistor PT7 is connected between the node N2 and N1B. Gates of the transistors PT4 and PT5 are connected to an address input terminal /adrin, while gates of the transistors PT6 and PT7 are connected to an address input terminal adrin. Note that the nodes N2 and N2B are connected to input terminals SSL and SSLB of the sense amplifier, respectively.

Note that selection of the bit line BL and auxiliary bit line BLB can be realized by the transistors PT4 to PT7 instead of the transistors PT8 and PT9. For example, when the address input terminal adrin and /adrin are both set at a high level, the transistors PT4 to PT7 are all turned off and the bit line BL and auxiliary bit line BLB become non-selected. At this time, transistors PT8 and PT9 can be omitted.

Address input terminals adrin and /adrin are set at a level in accordance with one bit in the address signal ADRa input via an address bus. For example, when the address bit is "1", the address input terminal adrin is set at a high level and /adrin is set at a low level. Inversely, when the address bit is "0", the address input terminal adrin is set at a low level and /adrin is set at a high level.

When the address input terminal adrin is at a high level and /adrin is at a high level, since the transistors PT4 and PT5 are turned on and the transistors PT6 and PT7 are turned off, signals of the nodes N1 and N1B are input to the nodes N2 and N2B, respectively. Inversely, when the address input terminal adrin is at a low level and /adrin is at a high level, since the transistors PT4 and PT5 are turned off and the transistors PT6 and PT7 are turned on, signals of the nodes N1 and N1B are input to the nodes N2B and N2, respectively.

Namely, when the above predetermined address bit is "1", signals of the bit lines BL and auxiliary bit line BLB are output as they are to the nodes N2 and N2B, while when the address bit is "0", signals of the bit line NL and the auxiliary bit line BLB are transposed and output to the nodes N2 and N2B. More specifically, when the address bit is "1", the reading data "1" is output as "1", and the reading data "0", is output as "0". Inversely, when the address bit is "0", the reading data "1" is output as "0" and the reading data "0" is output as "1". As explained above, XOR calculation of the reading data of the bit line BL and the auxiliary bit line BLB and the address bit is performed by on/off control of the transistors PT4 to PT7. Therefore, a processing time of the logic calculation is a voltage setup time of the address input terminals adrin and /adrin in accordance with the address bit and an on/off switching time of the transistors PT4 to PT7. It is possible to realize a lower amplitude level of a signal to be processed and shorter processing time comparing with a CMOS type logic calculation circuit of the related art.

Since output signals from the nodes N2 and N2B indicating the logic calculation results have a little amplitude as same as the signals on the bit line BL and the auxiliary bit line BLB, they are amplified by the sense amplifier 304 and output.

Note that the column switch 303a having XOR shown in FIG. 5 is a partial circuit corresponding to one bit of tag data. An actual circuit is configured that the circuits shown in FIG. 5 are arranged in parallel for the number of bits of the tag data. The respective bits of an address signal ADRa are input to the respective column switch, and XOR calculation is performed on each bit of tag data and address signal ADRa. The calculation result is amplified by the sense amplifier 304, the amplitude is converted by the level conversion circuit 305 in accordance with need and a hit signal $S_{hit}$ is generated by the hit signal generation circuit 35.

Below, general hit judgement operation of a cache memory of the present embodiment is explained with reference to FIGS. 4 and 5.

Hit judgement in the cache memory is performed based on a judgement result whether or not the tag data read from the tag memory 32 matches the address signal ADRa. Namely, judgement of hit includes reading of tag data from the tag memory 32 and comparing operation of tag data and address. Comparison of the tag data and address can be realized by XOR calculation on respective bits. In the present embodiment, XOR calculation processing is performed on the tag data and the address by the column switch having XOR 303a.

The reading from the tag memory 32 is performed by activating a word line specified by the row decoder 301 and activating a column selection signal corresponding to a bit specified by the column decoder 302. Respective memory cells connected to the activated word line are selected and levels of a bit line and auxiliary bit line connected to the respective memory cells are set in accordance with tag data stored therein.

The column data 302 controls the column selection signal line YSEL1B. For example, the column selection signal line YSEL1 is held at a high level by the column decoder 302. In accordance therewith, the bit line and the auxiliary bit line are precharged. After the precharging, the selected word line is activated by the row decoder 301, and there arises a potential difference between the bit lines BL and the auxiliary bit line BLB in accordance with tag data stored in the respective memory cells connected thereto. Namely, reading data is expressed by the potential difference of the bit line BL and the auxiliary bit line BLB at reading.

After that, the column selecting signal line YSEL1B is held at a low level by the column decoder 302, so data of the bit line BL and the auxiliary bit line BLB is output to the nodes N1 and N1B, respectively. An XOR calculation circuit comprising the transistors PT4 to PT7 operates XOR calculation with the address signal ADRa on every bit.

The calculation result of the XOR is expressed by the potential difference of the nodes N2 and N2B in almost the same way as in the reading signal on the bit line BL and the auxiliary bit line BLB. Note that since the potential difference has a very small amplitude, it is amplified by the sense amplifier 304, converted the level in accordance with need and supplied to the bit signal generation circuit 35. In the bit signal generation circuit 35, a hit signal $S_{hit}$ is generated in accordance with the comparison result of the read tag data and address signal ADRa.

The cache control circuit 31 controls data reading in accordance with $S_{hit}$. For example, when the tag data and the address signal ADRa are matched and a hit signal $S_{hit}$ is generated, data which the CPU 10 tries to read from the main memory is stored in the cache memory 30. In this case, the cache control circuit 31 reads data from the data memory 33 of the cache memory 30 and outputs the same to the data bus 40. Namely, when it is judged to be hit in the cache memory 30, data is read from the high speed cache memory instead of the main memory 20 and provided to the CPU 10, thus, a higher speed in data reading can be attained.

As explained above, according to a cache memory of the present invention, being provided with a tag memory for storing tag information and a column switch having an XOR calculation function, XOR calculation for judging whether the tag information and an address match is performed on every bit on a signal having a small amplitude on a bit line, and a high speed logic calculation can be realized, thus, there is an advantage that a cache memory capable of attaining a shorter access time can be realized.

While the invention has been described with reference to specific embodiment chosen for purpose of illustration, it should be apparent that numerous modifications could be made thereto by those skilled in the art without departing from the basic concept and scope of the invention.

What is claimed is:

1. A column switch in a memory device, wherein each memory cell in the memory device is connected to a bit line and an auxiliary bit line, for outputting a differential voltage set on said bit line and auxiliary bit line in accordance with memory data of said memory cell when reading data from the memory cell, said column switch receiving an input signal of a first or second logic state, and outputting a differential signal on said bit line and auxiliary bit line to the sense amplifier when said input signal is in said first logic state, and outputting a differential signal on said bit line and auxiliary bit line being logically inversed and outputs to said sense amplifier when said input signal is in said second logic state;

wherein the column switch further includes:
  a first switching element connected between said bit line and a first input terminal of said sense amplifier;
  a second switching element connected between said auxiliary bit line and a second input terminal of said sense amplifier;
  a third switching element connected between said bit line and said second input terminal of said sense amplifier; and
  a fourth switching element connected between said auxiliary bit line and said first input terminal of said sense amplifier;

wherein said first and second switching elements become conductive when said input signal is in said first logic state, and said third and fourth switching elements become conductive when said input signal is in said second logic state.

2. A column switch as set forth in claim 1, wherein said first and second switching elements are respectively connected between said bit line and said first input terminal of said sense amplifier, and between said auxiliary bit line and said second input terminal of said sense amplifier, and comprised of a transistor whose control terminal is applied said input signal; and said third and fourth switching elements are respectively connected between said auxiliary bit line and said first input terminal of said sense amplifier, and between said bit line and said second input terminal of said sense amplifier, and comprised of a transistor whose control terminal is applied a logically inversed signal of said input signal.

3. A cache memory, comprising a tag memory for storing tag information and a data memory for storing data corresponding to said tag information, for comparing an address and said tag information stored in said tag memory at the time of reading, and outputting said data corresponding to said tag information when said address and said tag information are matched, comprising:

a column switch being set a signal potential of a bit line connected to the respective memory cells in accordance with memory data of respective cells in said tag memory, and outputting a signal potential or a logically inversed signal of the signal potential of said bit line in accordance with the respective bits of said address being "0" or "1";

a sense amplifier for amplifying an output signal of said column switch; and a hit judgement circuit for judging whether or not said address and said tag information are matched in accordance with an output signal of said sense amplifier.

4. A cache memory as set froth in claim 3, wherein the respective memory cells in said tag memory are connected to a bit line and an auxiliary bit line, to which a differential potential is set in accordance with the memory data of the memory cell at the time of reading, wherein said column switch comprises:

a first switching element connected between said bit line and a first input terminal of said sense amplifier;

a second switching element connected between said auxiliary bit line and a second input terminal of said sense amplifier;

a third switching element connected between said bit line and said second input terminal of said sense amplifier; and a fourth switching element connected between said auxiliary bit line and said first input terminal of said sense amplifier; and wherein said first and second switching elements become conductive when a predetermined bit of said address is "0", while said third and fourth switching elements become conductive when a predetermined bit of said address is "1".

5. A cache memory as set froth in claim 4, wherein said first and second switching elements are respectively connected between said bit line and said first input terminal of said sense amplifier, and between said auxiliary bit line and said second input terminal of said sense amplifier, and comprised of a transistor whose control terminal is applied a signal in accordance with a predetermined bit value of said address, and wherein said third and fourth switching elements are respectively connected between said auxiliary bit line and said first input terminal of said sense amplifier, and between said bit line and said second input terminal of said sense amplifier, and comprised of a transistor whose control terminal is applied a logically inversed signal of a signal of a predetermined bit value of said address in accordance with a predetermined bit value of said address.

* * * * *

UNITED STATES PATENT AND TRADEMARK OFFICE
CERTIFICATE OF CORRECTION

PATENT NO.   : 6,515,916 B2  
DATED        : February 4, 2003  
INVENTOR(S)  : Yukihiro Takarabe It is certified that error appears in the above-identified patent and that said Letters Patent is hereby corrected as shown below:

Column 10,
Lines 20 and 42, replace "froth" with -- forth --.

Signed and Sealed this

Seventh Day of October, 2003

JAMES E. ROGAN
*Director of the United States Patent and Trademark Office*